United States Patent [19]
Bennett et al.

[11] Patent Number: 5,781,566
[45] Date of Patent: Jul. 14, 1998

[54] CYCLIC REDUNDANCY CODER

[75] Inventors: Irwin Bennett, Swindon; Barry King, Peatmoor; Andrew Page; Paul Golding, both of Swindon, all of United Kingdom

[73] Assignee: Motorola, Inc., Schaumburg, Ill.

[21] Appl. No.: 669,671

[22] Filed: Jun. 24, 1996

[51] Int. Cl.[6] .................................................. H03M 13/00
[52] U.S. Cl. ............................................................. 371/37.07
[58] Field of Search ............................... 371/31.07, 37.6, 371/53

[56] References Cited

U.S. PATENT DOCUMENTS 3,678,469  7/1972  Freeman et al. ............... 371/37.07
5,321,704  6/1994  Erickson ........................ 371/37.1

FOREIGN PATENT DOCUMENTS

0260413A2  7/1987  European Pat. Off.
61-237521 A  10/1986  Japan.
63-128819 A  6/1988  Japan.

*Primary Examiner*—Stephen M. Baker
*Attorney, Agent, or Firm*—Heather L. Creps

[57] ABSTRACT

A cyclic redundancy coder (10) is arranged to reduce to a minimum the number of processing steps required in a processor, such as a DSP, to achieve a cyclic redundancy coding function. The cyclic redundancy coder (10) comprises a shift register (12) having a plurality of storage elements each for storing a bit of a cyclic redundancy code word. A tap register (16) stores a tap position indicator indicative of tap positions in the cyclic redundancy code word that are subject to a logical operation. An input (18) provides input data to the cyclic redundancy coder. A logic feedback network (20–28) receives the data from the input and provides the logical operation. The logic feedback network also provides a plurality of data bits generated in response to the input data and each bit contained in each storage element identified by the tap position indicator. The cyclic redundancy code word is produced by applying at least one of the plurality of data bits to one storage element that is adjacent a tap position.

2 Claims, 2 Drawing Sheets

CYCLIC REDUNDANCY CODER

BACKGROUND OF THE INVENTION

This invention relates, in general, to cyclic redundancy coders and is particularly, but not exclusively, applicable to cyclic redundancy coders utilised with digital signal processors (DSPs).

SUMMARY OF THE PRIOR ART

Infrastructure of modern communications systems, such as the pan-European GSM (Groupe Speciale Mobile) cellular communications system, is required to undertake and successfully execute a multitude of complex tasks. For example, the infrastructure is required to administer such tasks as communication hand-off between discrete cells of the communication system, and also the encryption or decryption of information (either voice or data) that is transmitted over a communication resource of the system.

In general, the number of components in a base station, for example, required to realise a particular function offered by that base station is related to the intensity of the tasks performed to execute that function, and the processing capability of the components on which the function is performed. However, as a consequence of the ever-increasing competition in the market-place for communications systems, manufacturers in general have found it necessary to produce low cost, reliable equipment that can cope with the ever increasing demands of system operation and functionality. In this respect, manufacturers have attempted to reduce to a minimum the number of components, such as DSPs, and to optimise the use of these components.

Clearly, increasing the speed of operation of components results in an increase in the processing (handling) capacity of each component and hence an increased throughput, which increased throughput may permit elimination of some components. Also, in combination with the development of faster components, manufacturers have reduced component count by developing dedicated, integrated circuits that perform specific functions as efficiently as possible. However, in this latter case, manufacturers have experienced that such development is both costly in time and money and can often lead to a structural solution that is inflexible and therefore difficult to adapt to future needs. As such, development of dedicated integrated circuits is only really acceptable when the requirements of the system are known, understood or stable. Furthermore, although the increase in processing power ultimately provides a cheaper and more flexible solution, current technologies (such as DSP technology) have placed an upper limit on component (device) speed that is insufficient to meet the present-day requirements and aspirations of manufacturers.

One particular function that requires extensive processing power, i.e. the extensive use of DSPs, arises from the cyclic redundancy coding requirements of inter alia the aforementioned GSM communication system. More specifically, these cyclic redundancy codes are used for error detection and correction of control channel information and speech traffic channel information in a channel coder of a Base Transceiver Station (BTS), for example. Furthermore, these cyclic redundancy codes are defined (in GSM Technical Specification 05.03) by a polynomial expression of the form:

$$\text{gcrc}(D) = (D23+1)(D17+D3+1), \text{ then expanding}$$
$$= D40+D26+D23+D17+D3+1$$

where D(x) is a data bit from a register.

Although this polynomial expression currently defines the cyclic redundancy code, there is a likelihood that this code will be modified (or further new codes developed) to improve speech quality provided by the GSM channel coder unit. Therefore, since these additional cyclic redundancy codes are yet to be defined, the potential inflexibility imposed through the use of dedicated integrated circuits on future adaptations of existing infrastructure deters the use of such dedicated circuits.

As such, there is a requirement to provide a method of increasing the efficiency of a DSP in performing cyclic redundancy coding, for example, in such a way that the number of calls that can be handled by the DSP is increased while, at the same time, ensuring that there is sufficient flexibility in the DSP structure or architecture to allow the DSP to be modified to accommodate new cyclic redundancy codes and therefore to extend the life of the equipment, e.g. infrastructure.

SUMMARY OF THE INVENTION

According to the present invention there is provided a cyclic redundancy coder comprising: a shift register having a plurality of storage elements each for storing a bit of a cyclic redundancy code word; a tap register for storing a tap position indicator indicative of tap positions in the cyclic redundancy code word that are subject to a logical operation; an input for providing input data to the cyclic redundancy coder; and a logic feedback network coupled to receive the input data and arranged to provide the logical operation; the logic feedback network providing a plurality of data bits generated in response to the input data and each bit contained in each storage element identified by the tap position indicator, and producing the cyclic redundancy code word by applying at least one of the plurality of data bits to one storage element that is adjacent a tap position.

An exemplary embodiments of the present invention will now be described with reference to the accompanying drawings.

DETAILED DESCRIPTION OF A PREFERRED EMBODIMENT

Figure 1:
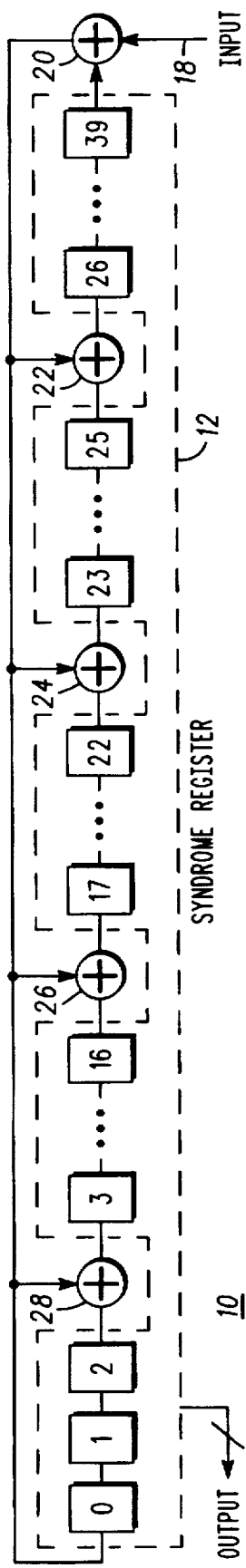
FIG. 1 is a representation of a cyclic redundancy code function implemented by the present invention.
Figure 2:
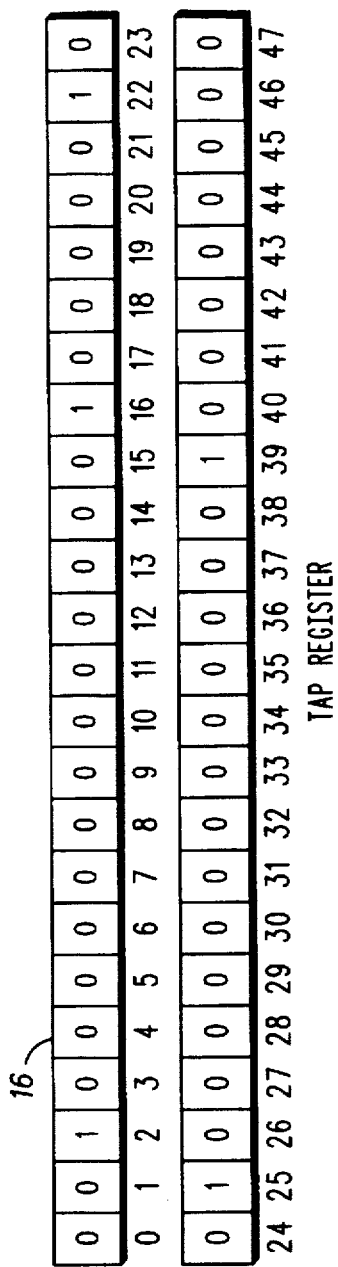
FIG. 2 is a register configuration of a preferred embodiment of the present invention.

FIGS. 1 and 2 represent, in combination, a cyclic redundancy coder and its function, generally depicted 10, implemented by the present invention. A syndrome register 12 is arranged to store a plurality of data bits to make up a data word (representing a cyclic redundancy code), which is output (typically in parallel) from the syndrome register 12 at an appropriate point in time. In the case of FIG. 1, the syndrome register contains forty-eight storage elements (0 to 47) each capable of storing a data bit.

As will be appreciated, the length of the syndrome register 12 is somewhat arbitrary because it need only be sufficient to store the data word (or the number of bits required to generate a polynomial that satisfies the requirements of a cyclic redundancy code calculation). In this respect, a length register 14 is provided to set the requisite length of the syndrome register. More specifically, consecutive storage elements of the length register 14 are set to a common logical value (in this case logical "1") to indicate the length of the code word (or data bits of interest) in the syndrome register 12. As can be seen, the length register 14 has bits 0 to 39 set to logical 1, thereby defining the length of the code word (or the bits of interest in the syndrome register 12) as being forty bits in length. By providing a length register, the length of the syndrome register may be altered according to the requirements of any cyclic redundancy code by simply re-programming the length register 14 with the appropriate number of consecutive, common logic values. Clearly, the length register 14 may be eliminated if the syndrome register is of a predetermined length, although such a structural limitation will affect the ability to alter or adapt the cyclic redundancy function.

In addition to the syndrome register and the length register, there is provided a tap register 16 that is arranged to store a plurality of data bits that identify bit positions in the syndrome register 12 that are subject to logical operations (e.g. exclusive-OR (XOR)) during execution of the cyclic redundancy code function. By way of example, bits 2, 16, 22, 25 and 39 have been identified (through the assignment of a logical "1" to each respective bit) as requiring tapping to implement the cyclic redundancy code. Again, like the length register 14, the tap register 16 is programmable to allow the tap positions to be re-defined at any time. Indeed, this re-programming may be implemented in real-time so that equipment can be adapted to receive a particular identified format of algorithm.

Figure 3:
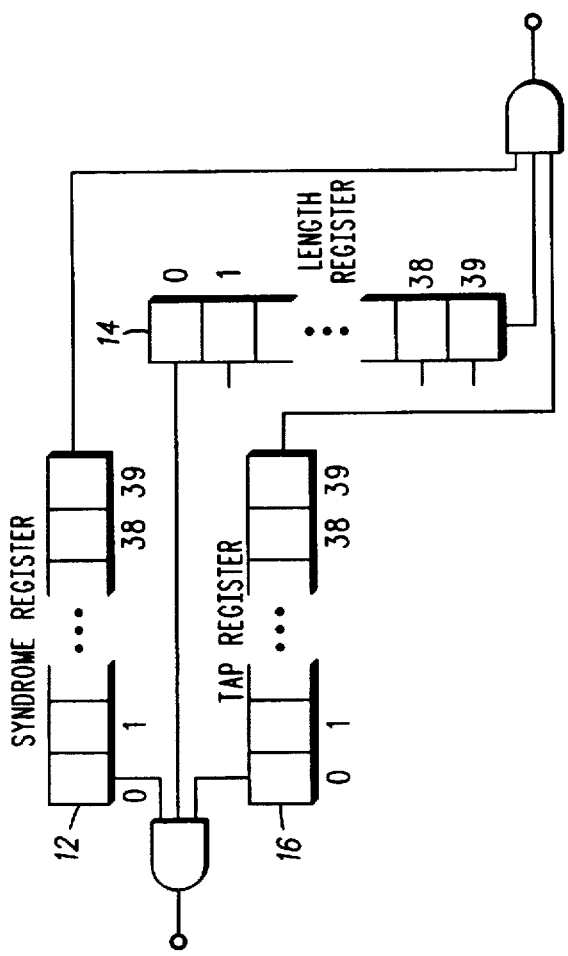
FIG. 3 is illustrates a logical combination of corresponding bits of the registers of FIG. 2.

By logically combining (ANDing) corresponding bits of the syndrome register 12, the length register 14 and the tap register 16 (as illustrated in FIG. 3), bits in the syndrome register 12 are identified as requiring a logical operation to be performed thereon. With respect to FIG. 3, only two such AND gates are illustrated for the sake of clarity, although it will be appreciated that such logical coupling between corresponding bits is required.

Referring back specifically to FIG. 1, input data is applied to a first exclusive-OR (XOR) logic gate 20. Typically, the input data is first stored in an input register 18 and then sequentially entered into the first XOR logic gate. However, it will be appreciated that the input data may be distributed across a block of memory whereby a data bit counter and a memory pointer are employed to successively load the input data into the first XOR logic gate 20. An output from first XOR logic gate 20 is applied as a first input to secondary XOR logic gates 22, 24, 26 and 28. The output from XOR gate 20 is also applied to the most significant bit, i.e. bit 0, of the syndrome register 12. Secondary XOR logic gates 22, 24, 26 and 28 each derive a second input, respectively, from bits 25, 22, 16 and 2 of the syndrome register 12. A result from each secondary XOR logic gate 22, 24, 26 and 28 is supplied (coupled) to an adjacent (less significant) bit in the syndrome register 12, except the output from the least significant bit (bit 39) which is applied as a second input to first XOR logic gate 20. As such, the numerous logic gates together comprise a logic network that is interactive with particular bits in the syndrome register 12. Also, it will be appreciated that the logic network provides a closed, feedback path.

In operation, the input signal 18 (a single data bit) is exclusively-ORed in the first XOR gate 20 with the least significant bit (bit 39) of the syndrome register 12. The resultant output is then exclusively-ORed by each secondary XOR gate with the relevant logic value contained in the bits of the syndrome register that are tapped (by tap register 16). The result from each secondary XOR gate 22, 24, 26 and 28 is then shifted into the adjacent (less significant) bit. This operation represents one clock cycle. As will be appreciated, the syndrome register 12 may be initialised with all logical "0s", although any predefined code word would be acceptable.

It will be appreciated that the cyclic redundant function may require other forms of logic gates, such as OR gates, and that these may be appropriately combined or substituted in the logical network required by the cyclic redundancy code.

Figure 4:
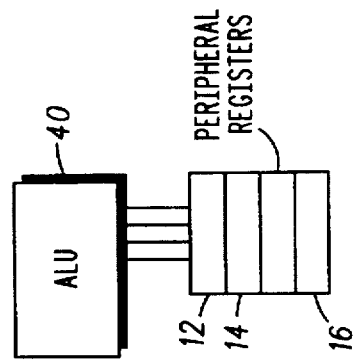
FIG. 4 illustrates a block diagram of the general concepts of the present invention.

In general, the number of processing steps required in a DSP to implement a cyclic redundancy coding function has been reduced by providing dedicated peripheral registers that identify tap positions (from a shift register, i.e. the syndrome register 12) required in a feedback path. Subsequently, the logical combination of corresponding bits of the registers produces a result that can be input directly into a processing unit to produce a desired function in one processing step. This is illustrated in FIG. 4, in which an arithmetic logic unit (ALU) 40 is coupled to a block of peripherals registers containing length and tap registers, with the ALU 40 arranged to perform a one-step operation to actuate the desired cyclic redundancy code function.

According to the present invention, tasks that require extensive processor activity (i.e. tasks that require multi-step instructions) have been replaced, where possible, by a hardware solution in which the number of processor steps required to execute a particular task has been reduced to a minimum. Consequently, the processor (such as a DSP) has a perceptual increase in processing power (capacity). Since previous multi-step tasks are now performed in a single instruction, there is a reduction in the time necessary to perform the task and therefore an increase in the number of such tasks that can be performed in unit time. As such, the throughput provided by each DSP is increased, thus allowing fewer DSPs to handle more voice communications in a base station of a communication system, for example.

Not only does the present invention provide the flexibility that allows adaptation of infrastructure equipment in which the present invention is installed, but there is a relative saving in cost over the prior art solution of developing dedicated, integrated circuits. Accordingly, the numerous aspects of the present invention provide a processing methodology and structure that is efficient (in as much as it requires only one step to be implemented in a DSP, for example) and flexible.

As will be appreciated, the concepts of the present invention are applicable to any equipment that utilises DSPs for coding or the like, such equipment including subscriber handsets, O&Ms (Operation and Maintenance) infrastructure and Base Stations.

We claim:

1. A cyclic redundancy coder comprising:
   a shift register having a plurality of storage elements each for storing a bit of a cyclic redundancy code word;
   a tap register for storing a tap position indicator indicative of tap positions in the cyclic redundancy code word that are subject to a logical operation;
   an input for providing input data to the cyclic redundancy coder;

a logic feedback network coupled to receive the input data and arranged to provide the logical operation; the logic feedback network providing a plurality of data bits generated in response to the input data and each bit contained in each storage element identified by the tap position indicator, and producing the cyclic redundancy code word by applying at least one of the plurality of data bits to the storage element that is adjacent a tap position; and a length register for storing a length indicator, the length register being logically coupled to the shift register whereby the length indicator sets a length of the shift register corresponding to a length of the cyclic redundancy code word, the length of the cyclic redundancy code word being programmable during operation of the cyclic redundancy coder.

2. The cyclic redundancy coder of claim 1, wherein the logic feedback network comprises a plurality of exclusive-OR units.

* * * * *